(12) United States Patent
Lin

(10) Patent No.: US 9,147,642 B2
(45) Date of Patent: Sep. 29, 2015

(54) INTEGRATED CIRCUIT DEVICE

(71) Applicant: NANYA TECHNOLOGY CORPORATION, Tao-Yuan Hsien (TW)

(72) Inventor: Po-Chun Lin, Changhua County (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 14/067,989

(22) Filed: Oct. 31, 2013

(65) Prior Publication Data

US 2015/0115462 A1  Apr. 30, 2015

(51) Int. Cl.
*H01L 23/48* (2006.01)
*H01L 23/498* (2006.01)
*H01L 21/768* (2006.01)

(52) U.S. Cl.
CPC ........ *H01L 23/481* (2013.01); *H01L 23/49827* (2013.01); *H01L 21/76898* (2013.01)

(58) Field of Classification Search
CPC ............ H01L 21/76898; H01L 23/481; H01L 23/49827
USPC .................. 257/621, 774, E21.597, E23.011
See application file for complete search history.

(56) References Cited

U.S. PATENT DOCUMENTS

| | | | |
|---|---|---|---|
| 7,943,513 B2 | 5/2011 | Lin | |
| 8,148,824 B2 | 4/2012 | Lin | |
| 8,202,801 B1 | 6/2012 | Lin | |
| 8,486,823 B2 * | 7/2013 | Chiou et al. | 438/622 |
| 2009/0294983 A1 * | 12/2009 | Cobbley et al. | 257/774 |
| 2010/0048019 A1 * | 2/2010 | Kawano et al. | 438/675 |
| 2010/0148371 A1 * | 6/2010 | Kaskoun et al. | 257/777 |
| 2010/0264548 A1 * | 10/2010 | Sanders et al. | 257/774 |
| 2011/0169140 A1 | 7/2011 | Moroz | |
| 2011/0180936 A1 | 7/2011 | Cobbley et al. | |
| 2011/0316168 A1 * | 12/2011 | Moon et al. | 257/774 |
| 2012/0056330 A1 * | 3/2012 | Lee et al. | 257/774 |
| 2012/0267788 A1 * | 10/2012 | Hong et al. | 257/774 |
| 2013/0119547 A1 * | 5/2013 | Kim et al. | 257/751 |
| 2013/0161824 A1 * | 6/2013 | Choi et al. | 257/774 |
| 2013/0161828 A1 * | 6/2013 | Lamy | 257/774 |
| 2013/0249047 A1 * | 9/2013 | Hung et al. | 257/506 |

* cited by examiner

*Primary Examiner* — Marvin Payen
*Assistant Examiner* — Jeremy Joy
(74) *Attorney, Agent, or Firm* — CKC & Partners Co., Ltd.

(57) ABSTRACT

An integrated circuit device includes a substrate, at least one transistor, at least one metal layer, a conductive pillar, and a connecting structure. The substrate has at least one via passing therethrough. The transistor is at least partially disposed in the substrate. The metal layer is disposed on or above the substrate. The conductive pillar is disposed in the via. The connecting structure is at least partially disposed in the via and connecting the conductive pillar and the metal layer. At least a first portion of the connecting structure is made of a stress releasing material having a coefficient of thermal expansion less than a coefficient of thermal expansion of the conductive pillar. A projection of the transistor in the via overlaps with the connecting structure.

14 Claims, 4 Drawing Sheets

INTEGRATED CIRCUIT DEVICE

BACKGROUND

1. Technical Field

The present disclosure relates to an integrated circuit device.

2. Description of Related Art

Through-Silicon Via (TSV) is a connection passing through the silicon substrate. In general, the TSV is made of copper, whose coefficient of thermal expansion (CTE) is much higher than that of the silicon substrate. A huge CTE mismatch between the copper and the silicon causes a stress therebetween if the silicon substrate is surrounded in different temperatures. The stress may reduce the carrier mobility of channels of transistors disposed in the silicon substrate. Therefore, the transistors may be disposed outside a keep out zone (KOZ) around the TSV to avoid the stress effect of the TVS, where the keep out zone is an area the stress of the TSV may affect the carrier mobility of transistors disposed nearby.

SUMMARY

An aspect of the present invention provides an integrated circuit device including a substrate, at least one transistor, at least one metal layer, a conductive pillar, and a connecting structure. The substrate has at least one via passing therethrough. The transistor is at least partially disposed in the substrate. The metal layer is disposed on or above the substrate. The partially disposed in the via and connecting the conductive pillar and the metal layer. At least a first portion of the connecting structure is made of a stress releasing material having a coefficient of thermal expansion less than a coefficient of thermal expansion of the conductive pillar. A projection of the transistor in the via overlaps with the connecting structure.

In one or more embodiments, the coefficient of thermal expansion of the first portion of the connecting structure is further greater than or equal to a coefficient of thermal expansion of the substrate.

In one or more embodiments, the first portion of the connecting structure is made of oxide.

In one or more embodiments, the connecting structure further has a second portion connecting the conductive pillar and the metal layer. The second portion of the connecting structure is made of a conductive material.

In one or more embodiments, the second portion of the connecting structure is surrounded by the first portion of the connecting structure.

In one or more embodiments, the second portion of the connecting structure is made of copper (Cu).

In one or more embodiments, a coefficient of thermal expansion of the second portion of the connecting structure is less than the coefficient of thermal expansion of the conductive pillar.

In one or more embodiments, the second portion of the connecting structure is made of tungsten (W).

In one or more embodiments, the entire connecting structure is made of the stress releasing material.

In one or more embodiments, the entire connecting structure is made of tungsten (W).

In one or more embodiments, the integrated circuit device further includes an insulating layer disposed in the via and around the connecting structure and the conductive pillar.

Another aspect of the present invention provides an integrated circuit device includes a substrate, at least one transistor, at least one metal layer, a conductive pillar, and a connecting structure. The substrate has at least one via passing therethrough. The transistor is disposed in the substrate. The metal layer is disposed on or above the substrate. The conductive pillar is disposed in the via. The connecting structure includes a connecting portion and a neck portion. The connecting portion is electrically connected to the metal layer. The neck portion is disposed between the conductive pillar and the connecting portion. The neck portion is narrower than the connecting portion. A projection of the transistor in the via overlaps with the neck portion.

In one or more embodiments, the neck portion is pillar-shaped.

In one or more embodiments, the neck portion gets narrower towards the connecting portion.

In one or more embodiments, the neck portion gets narrower towards the conductive pillar.

In one or more embodiments, the neck portion is curved inwards in the middle of the neck portion.

In one or more embodiments, the neck portion, the connecting portion, and the conductive pillar are all made of the same material.

In one or more embodiments, the neck portion, the connecting portion, and the conductive pillar are all made of copper (Cu).

In one or more embodiments, the neck portion is made of tungsten (W), and the conductive pillar is made of copper (Cu).

In one or more embodiments, the integrated circuit device further includes an insulating layer disposed in the via and around the conductive pillar and the connecting structure.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
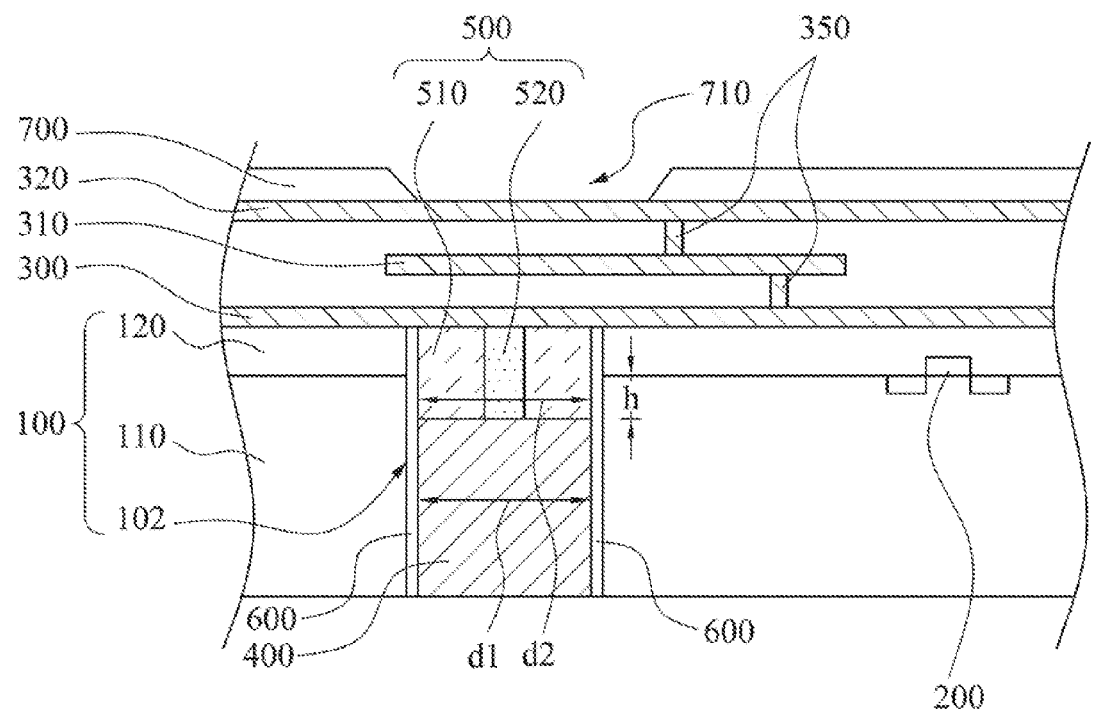
FIG. 1 is a cross-sectional view of an integrated circuit device according to the first embodiment of the present invention.

FIG. 1 is a cross-sectional view of an integrated circuit device according to the first embodiment of the present invention. As shown in FIG. 1, the integrated circuit device includes a substrate 100, at least one transistor 200, at least one metal layer 300, a conductive pillar 400, and a connecting structure 500. The substrate 100 has at least one via 102 passing therethrough. The transistor 200 is at least partially disposed in the substrate 100. The metal layer 300 is disposed on or above the substrate 100. The conductive pillar 400 is disposed in the via 102. The connecting structure 500 is at least partially disposed in the via 102 and connecting the conductive pillar 400 and the metal layer 300. A diameter d1 of the conductive pillar 400 is substantially the same as a diameter d2 of the connecting structure 500. At least a first portion 510 of the connecting structure 500 is made of a stress releasing material having a coefficient of thermal expansion (CTE) less than a coefficient of thermal expansion of the conductive pillar 400. A projection of the transistor 200 in the via 102 overlaps with the connecting structure 500.

In greater detail, the CTE of the substrate 100 is usually less than that of the conducting pillar 400, and since the CTE of the connecting structure 500 is also less than that of the conducting pillar 400 as mentioned above, the CTE difference between the substrate 100 and the connecting structure 500 can be smaller than that between the substrate 100 and the conductive pillar 400. In other words, the stress caused by the CTE mismatch between the substrate 100 and the connecting structure 500 can be reduced, such that the carrier mobility of a channel (not shown) of the transistor 200 affected by the stress can be released. In addition, since the stress between the substrate 100 and the connecting structure 500 is reduced, the keep out zone (KOZ), which may be defined as an area the transistor 200 having larger than 7% saturation current change if the transistor 200 disposed therein, around the connecting structure 500 can be shrunk, and leave more space for circuit layout of the integrated circuit device. Therefore, the transistor 200 can be disposed closer to the via 102 to form a higher density circuit in the integrated circuit device.

In this embodiment, the connecting structure 500 further has a second portion 520 connecting the conductive pillar 400 and the metal layer 300, and the second portion 520 of the connecting structure 500 is made of a conductive material. In other words, the conductive pillar 400 can be electrically connected to the metal layer 300 through the second portion 520. Therefore, the first portion 510 can be a non-conductive material, such as oxide. It should be noticed that although there is only one second portion 520 in FIG. 1, the scope of the claimed invention should not be limited in this respect. A person having ordinary skill in the art may design the number of the second portion 520 according to actual requirements.

In this embodiment, the second portion 520 of the connecting structure 500 is surrounded by the first portion 510 of the connecting structure 500, such that even if a CTE of the second portion 520 is higher than that of the first portion 510, the first portion 510 can buffer the CTE mismatch between the second portion 520 and the substrate 100, such that the stress existing between the connecting structure 500 and the substrate 100 may not affect the carrier mobility of the channel of the transistor 200.

In this embodiment, the CTE of the first portion 510 of the connecting structure 500 is further greater than or equal to a coefficient of thermal expansion of the substrate 100. Taking FIG. 1 for example, the substrate 100 may include a silicon base 110 and an oxide layer 120 disposed on the silicon layer 110. The CTE of the silicon layer 110 is about 3, and the CTE of the oxide layer 120 is about 9. The first portion 510 of the connecting structure 500 can be made of oxide, whose CTE is about 9. The second portion 520 of the connecting structure 500 and the conductive pillar 400 can be both made of copper (Cu), whose CTE is about 17. Therefore, the stress caused by the CTE mismatch between the connecting structure 500 and the substrate 100 can be buffered by the first portion 510 of the connecting structure 500, and the transistor 200 can be disposed closer to the via 102. According to a simulation result, when the diameter d of the via 102 was 20 μm, and the depth h of the connecting structure 500 in the silicon base 110 was 3 μm, the diameter of the keep out zone was 0 μm, which means the transistor 200 can be disposed adjacent to the via 102.

Figure 2:
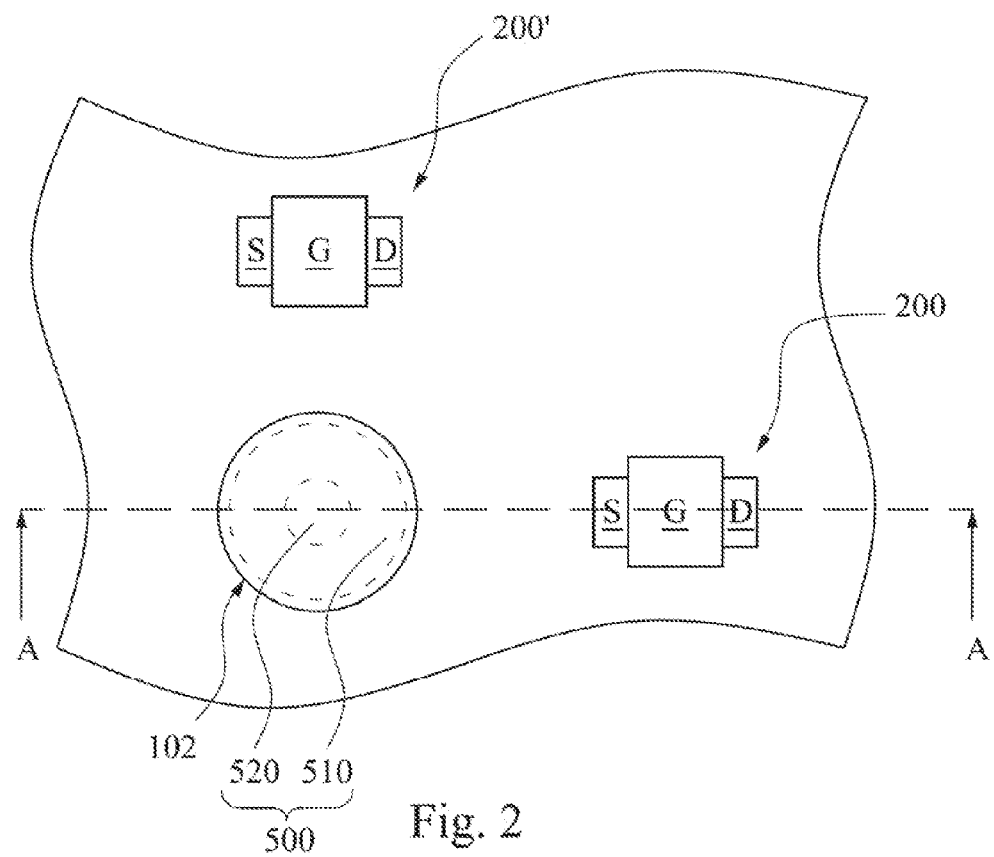
FIG. 2 is a top view of the integrated circuit device of FIG. 1.

Reference is made to FIG. 2 which is a top view of the integrated circuit device of FIG. 1, where the cross-sectional view of FIG. 1 is taken along line A-A of FIG. 2. As shown in FIG. 2, the transistor can be disposed around the via 102. A direction of the channel of the transistor can be defined as a direction pointing from a source S toward a drain D thereof. Taking the transistor 200 as an example, a direction of the channel of the transistor 200 is substantially parallel to the radial direction of the via 102, and the transistor 200 can be defined as a horizontal type transistor. In addition, the integrated circuit device can further include a transistor 200' whose direction of the channel is substantially perpendicular to the radial direction of the via 102, and the transistor 200 can be defined as a vertical type transistor. According to the simulation result mentioned above, the keep out zone of both horizontal type transistor and the vertical type transistor were 0 μm. Furthermore, with all the same parameters except the depth h being 0, the keep out zone of the vertical type transistor was also 0 μm.

It should be noticed that although the shape of the second portion 520 in FIG. 2 is cylindrical, the scope of the claimed invention should not be limited in this respect. A person having ordinary skill in the art may design the shape of the second portion 520 according to actual requirements.

Reference is made back to FIG. 1. In one or more embodiments, the integrated circuit device further includes an insulating layer 600 disposed in the via 102 and surrounding the connecting structure 500 and the conductive pillar 400. Some materials of the conductive pillar 400 may diffuse to the substrate 100 especially for the conductive pillar 400 made of copper and the substrate 100 made of silicon. Therefore, the insulating layer 600 can block the copper of the conductive pillar 400 to diffuse to the substrate 100 for avoiding the leakage current in the substrate 100.

In FIG. 1, metal layers 310 and 320 can be disposed above the metal layer 300 to form a 3D integrated circuit. Some conductors 350 can be respectively disposed between the metal layers 300 and 310, and between the metal layers 310 and 320 to makes electrically connections therebetween. Furthermore, a passivation layer 700 can be disposed on the metal layer 320 to protect the structure below the passivation layer 700. The passivation layer 700 may have an opening 710 to expose a portion of the metal layer 320, and a metal pillar bump or a solder (not shown) can be disposed at the opening 710 and connected to metal layer 320. Therefore, other circuit or device can be electrically connected to the integrated circuit device through the metal pillar bump or the solder. It should be noticed the number of the metal layers in FIG. 1 is illustrative only and should not limit the scope of the claimed invention. A person having ordinary skill in the art may design a proper number of the metal layers according to actual requirements.

In one or more embodiments, the coefficient of thermal expansion of the second portion 520 of the connecting structure 500 can be less than the coefficient of thermal expansion of the conductive pillar 400. In other words, the entire connecting structure 500 is made of the stress releasing material. For example, the second portion 520 of the connecting structure can be made of tungsten (W), whose CTE is about 5, and the conductive pillar 400 can be made of copper. Therefore, the second portion 520 made of tungsten not only can be electrically connecting the metal layer 300 and the conductive pillar 400, but also can further reduce the stress between the connecting structure 500 and the substrate 100.

Figure 3:
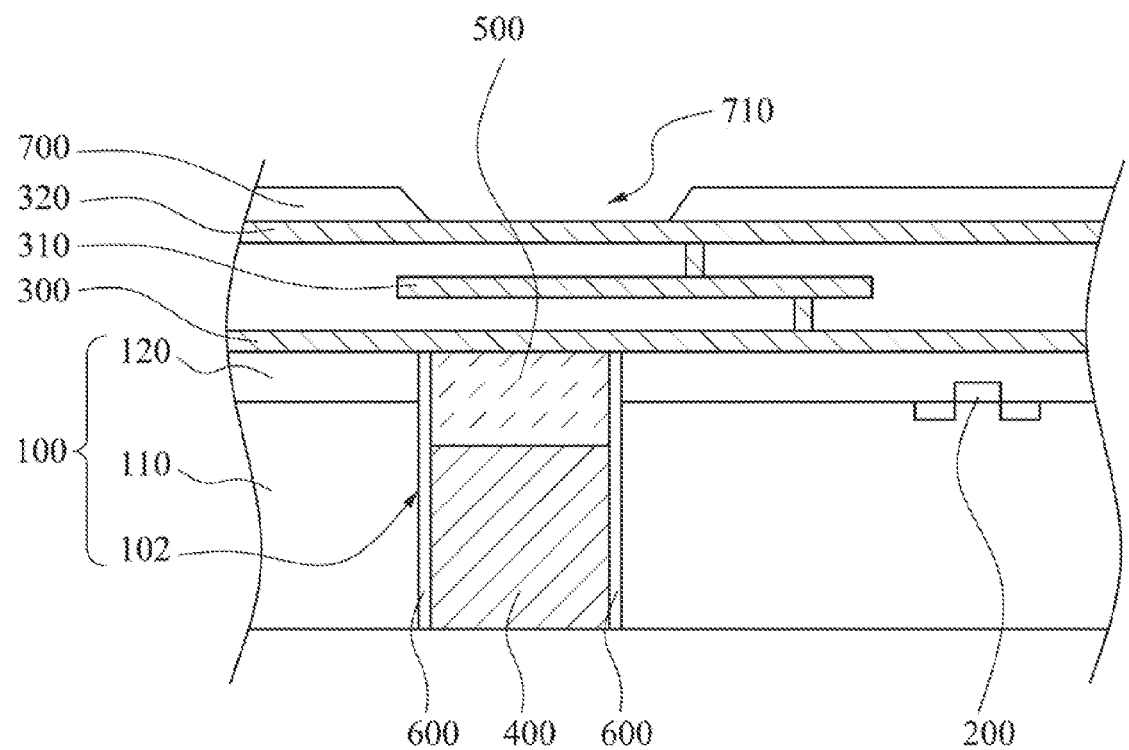
FIG. 3 is a cross-sectional view of the integrated circuit device according to the second embodiment of the present invention.

Reference is made to FIG. 3 which is a cross-sectional view of the integrated circuit device according to the second embodiment of the present invention. The difference between the second embodiment and the first embodiment is the structure of the connecting structure 500. In this embodiment, the entire connecting structure 500 is made of stress release material with conductive. In other words, the entire connecting structure 500 can be electrically connecting the conductive pillar 400 and the metal layer 300, leading to a higher conductivity between the conductive pillar 400 and the metal layer 300. In this embodiment, the entire connecting structure 500 can be made of tungsten, and the conductive pillar 400 can be made of cpper. However, the scope of the claimed invention should not be limited in this respect. Basically, an embodiment falls within the scope of the claimed invention if the CTE of the first portion 510 (see FIG. 1) or the entire connecting structure 500 is less than that of the conductive pillar 400. Other relevant structural details of the second embodiment are all the same as the first embodiment, and, therefore, a description in this regard will not be repeated hereinafter.

Figure 4:
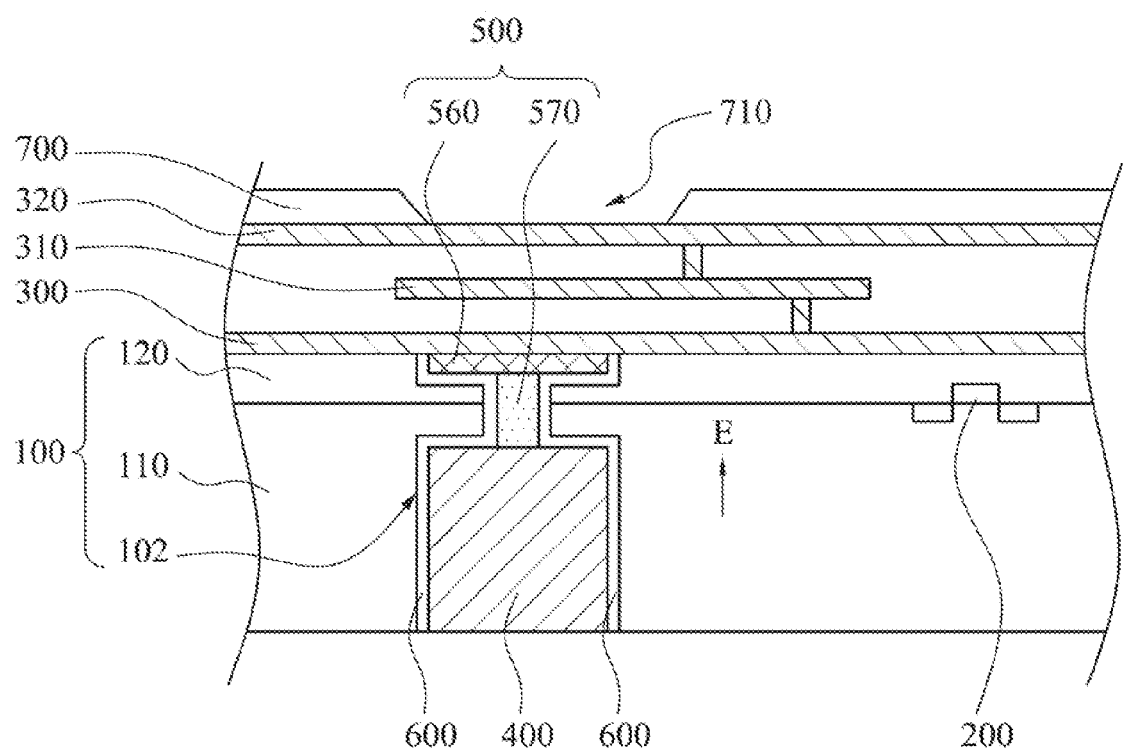
FIG. 4 is a cross-sectional view of the integrated circuit device according to the third embodiment of the present invention.

Reference is made to FIG. 4 which is a cross-sectional view of the integrated circuit device according to the third embodiment of the present invention. The difference between the third embodiment and the first embodiment is the structure and the material of the connecting structure 500. In this embodiment, the connecting structure 500 includes a connecting portion 560 and a neck portion 570. The connecting portion 560 is electrically connected to the metal layer 300. The neck portion 570 is disposed between the conductive pillar 400 and the connecting portion 560. The neck portion 570 is narrower than the connecting portion 560 and the conductive pillar 400. The conductive pillar 400, the neck portion 570, and the connecting portion 560 are sequentially arranged along an extension direction E of the via 102. A projection of the transistor 200 in the via 102 overlaps with the neck portion 570.

In greater detail, since the neck portion 570 is narrower than the connecting portion 560 and the conductive pillar 400 as mentioned above, the keep out zone can be shrunk toward the neck portion 570, and leave more space for circuit layout of the integrated circuit device. Therefore, the transistor 200 can be disposed closer to the neck portion 570 to form a higher density circuit in the integrated circuit device.

In one or more embodiments, the neck portion 570, the connecting portion 560, and the conductive pillar 400 can be all made of the same material. For example, the neck portion 570, the connecting portion 560, and the conductive pillar 400 can be all made of copper. Although copper may have a CTE greater than the CTE of the substrate 100, which may cause a stress between the connecting portion 560 and the substrate 100 the keep out zone can be shrunk toward the neck portion 570, and leave more space for circuit layout of the integrated circuit device.

In one or more embodiments, the connecting structure 500 may has a coefficient of thermal expansion less than the coefficient of thermal expansion of the conductive pillar 400. Therefore, the CTE difference between the substrate 100 and the connecting structure 500 can be smaller than that between the substrate 100 and the conductive pillar 400. In other words, the stress caused by the CTE mismatch between the substrate 100 and the connecting structure 500 can be reduced, such that the carrier mobility of the channel of the transistor 200 affected by the stress can be released. In addition, since the stress between the substrate 100 and the connecting structure 500 is reduced, the keep out zone (KOZ) around the neck portion 570 can be shrunk, and the circuit layout area of the integrated circuit device can be further extended.

Figure 5:
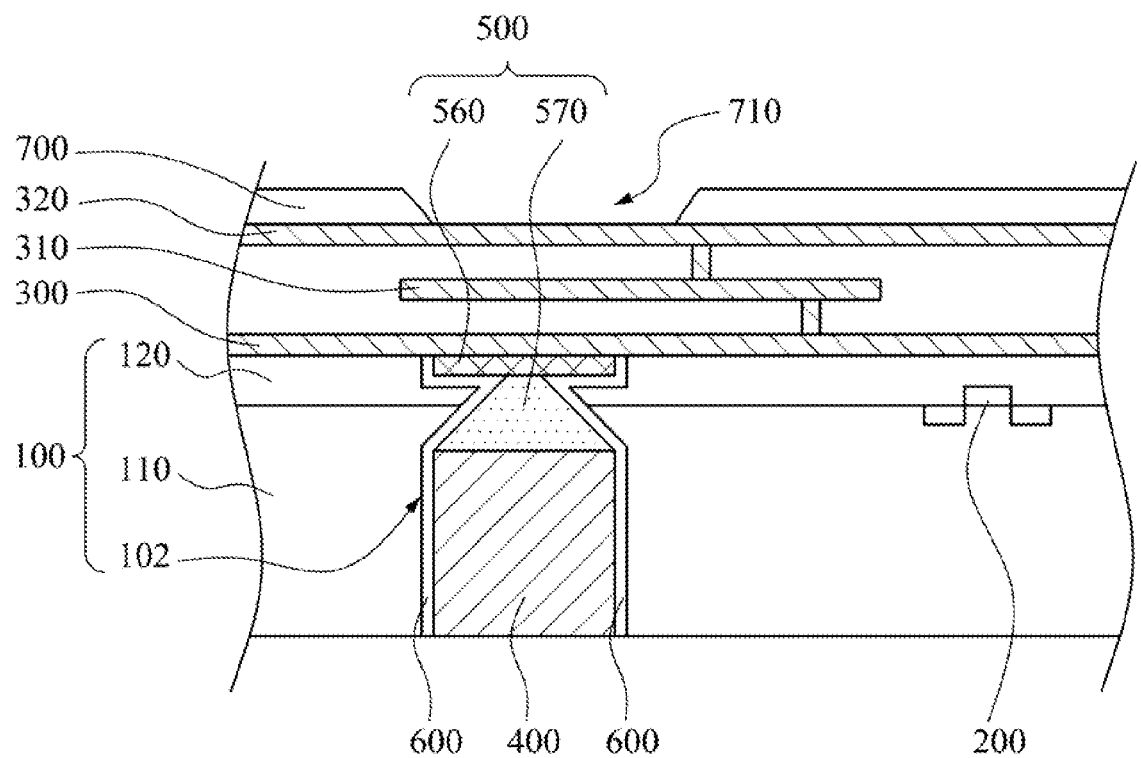
FIGS. 5 to 7 are cross-sectional views of the integrated circuit device according to the fourth to the sixth embodiments of the present invention.
Figure 6:
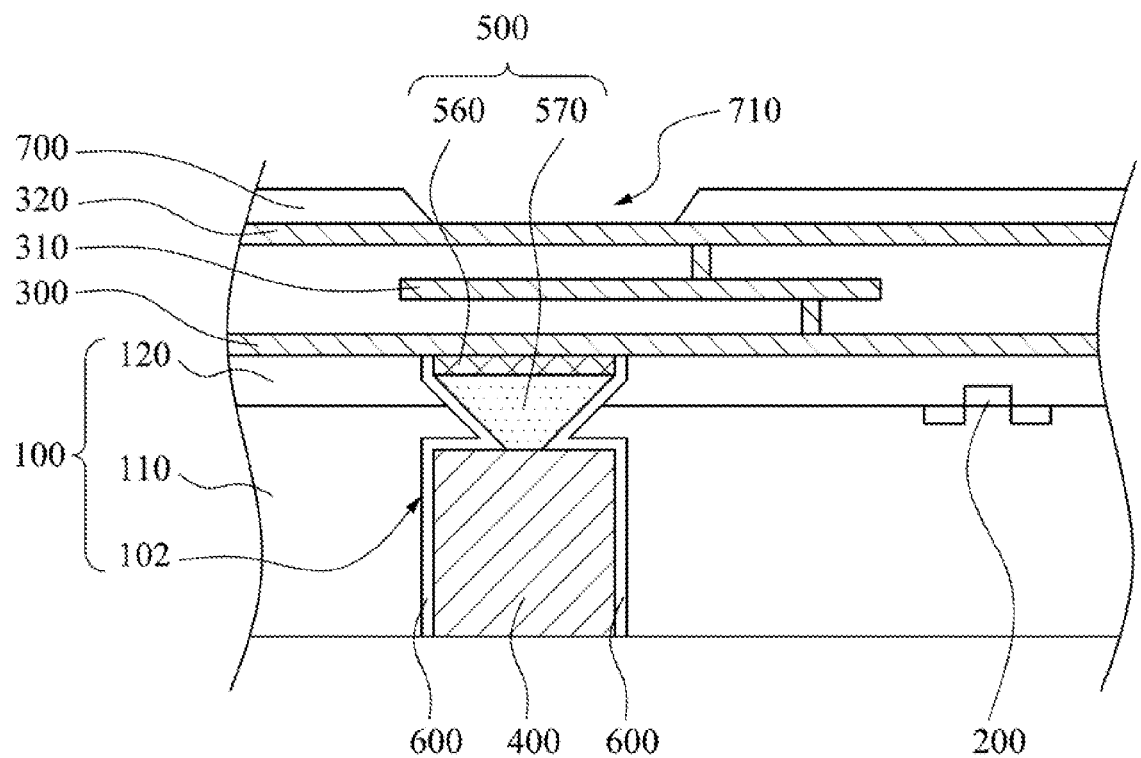
Figure 7:
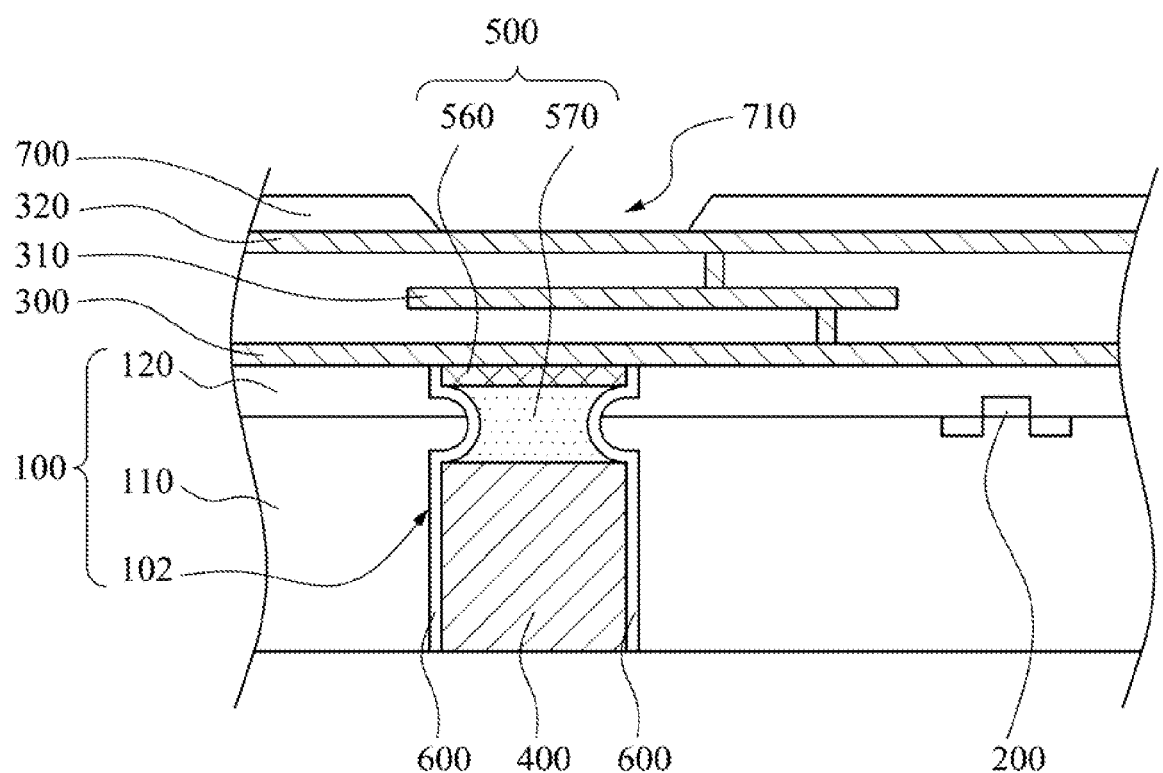

In this embodiment, the neck portion 570 is pillar-shaped. However, the scope of the claimed invention should not be limited in this respect. Reference is made to FIGS. 5 to 7 which are cross-sectional views of the integrated circuit device according to the fourth to sixth embodiments of the present invention. The difference between the fourth, the fifth, the sixth, and the third embodiment is the structure of the connecting structure 500. In the fourth embodiment, as shown in FIG. 5, the neck portion 570 gets narrower towards the connecting portion 560. In the fifth embodiment, as shown in FIG. 6, the neck portion 570 gets narrower towards the conductive pillar 400. In the sixth embodiment, as shown in FIG. 7, the neck portion 570 is curved inwards in the middle of the neck portion 570. All of the structure mentioned above can shrink the keep out zone toward the neck portion 570, and leave more space for circuit layout of the integrated circuit device. Other relevant structural details of the fourth, the fifth, and the sixth embodiments are all the same as the third embodiment, and, to therefore, a description in this regard will not be repeated hereinafter.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An integrated circuit device, comprising:
    a substrate having at least one via passing therethrough;
    at least one transistor at least partially disposed in the substrate;
    at least one metal layer disposed on or above the substrate;
    a conductive pillar disposed in the via; and
    a connecting structure at least partially disposed in the via and connecting the conductive pillar and the metal layer, wherein a diameter of the conductive pillar is substantially the same as a diameter of the connecting structure, the entire connecting structure is made of a stress releasing material having a coefficient of thermal expansion less than a coefficient of thermal expansion of the conductive pillar, a projection of the transistor in the via overlaps with the connecting structure, and the connecting structure comprises:
    a first portion made of oxide; and
    a second portion connecting the conductive pillar and the metal layer, and the second portion is made of a conductive material.

2. The integrated circuit device of claim 1, wherein the coefficient of thermal expansion of the first portion of the connecting structure is further greater than or equal to a coefficient of thermal expansion of the substrate.

3. The integrated circuit device of claim 1, wherein the second portion of the connecting structure is surrounded by the first portion of the connecting structure.

4. The integrated circuit device of claim 1, wherein the second portion of the connecting structure is made of tungsten (W).

5. The integrated circuit device of claim 1, further comprising:
    an insulating layer disposed in the via and surrounding the connecting structure and the conductive pillar.

6. An integrated circuit device, comprising:
    a substrate having at least one via passing therethrough;

at least one transistor disposed in the substrate;
at least one metal layer disposed on or above the substrate; and
a conductive pillar disposed in the via; and
a connecting structure disposed in the via, and the connecting structure comprising:
  a connecting portion electrically connected to the metal layer and disposed in the via; and
  a neck portion disposed between the connecting portion and the conductive pillar, wherein the neck portion is narrower than the connecting portion, the conductive pillar, the neck portion, and the connecting portion are sequentially arranged along an extension direction of the via, and a projection of the transistor in the via overlaps with the neck portion.

7. The integrated circuit device of claim 6, wherein the neck portion is pillar-shaped.

8. The integrated circuit device of claim 6, wherein the neck portion gets narrower towards the connecting portion.

9. The integrated circuit device of claim 6, wherein the neck portion gets narrower towards the conductive pillar.

10. The integrated circuit device of claim 6, wherein the neck portion is curved inwards in the middle of the neck portion.

11. The integrated circuit device of claim 6, wherein the neck portion, the connecting portion, and the conductive pillar are all made of the same material.

12. The integrated circuit device of claim 6, wherein the connecting structure has a coefficient of thermal expansion less than a coefficient of thermal expansion of the conductive pillar.

13. The integrated circuit device of claim 6, wherein the connecting structure is made of tungsten (W), and the conductive pillar is made of copper (Cu).

14. The integrated circuit device of claim 6, further comprising:
  an insulating layer disposed in the via and surrounding the conductive pillar and the connecting structure.

* * * * *